United States Patent [19]

Tanigaki

[11] 4,095,128
[45] June 13, 1978

[54] PUSH-PULL SWITCHING CIRCUIT WITH MINORITY CARRIER STORAGE DELAY

[75] Inventor: Hidetoshi Tanigaki, Nishinomiya, Japan

[73] Assignee: Furuno Electric Co., Ltd., Nagasaki, Japan

[21] Appl. No.: 764,609

[22] Filed: Feb. 1, 1977

[30] Foreign Application Priority Data

Feb. 3, 1976    Japan ................................. 51-10976

[51] Int. Cl.² ........................ H03K 17/60; H03F 3/26
[52] U.S. Cl. .................................. 307/254; 307/218;
       307/247 R; 307/300; 330/270
[58] Field of Search ........... 307/254, 255, 300, 247 R,
                                   307/218; 330/15

[56] References Cited

U.S. PATENT DOCUMENTS

| 2,892,103 | 6/1959 | Scarbrough | 307/247 R |
| 3,418,494 | 12/1968 | Reid | 307/247 R |
| 3,490,027 | 1/1970 | Galetto et al. | 330/15 |
| 3,538,353 | 11/1970 | Hanger | 307/255 |

Primary Examiner—Stanley D. Miller, Jr.
Assistant Examiner—B. P. Haws
Attorney, Agent, or Firm—Sughrue, Rothwell, Mion, Zinn and Macpeak

[57] ABSTRACT

A push-pull switching circuit including two grounded emitter transistors 5, 6 controlled by a pair of AND gates 3, 4. The collector output of each transistor is fed back to an input of the AND gate controlling the other transistor, the remaining AND gate inputs being supplied by the Q and $\overline{Q}$ outputs of a flip-flop circuit 2. During the prolonged conduction of each transistor due to minority carrier storage, its lowered collector potential prevents the enabled AND gate for the other transistor from raising its output and initiating conduction, thereby avoiding overlapping or simultaneous transistor conduction.

4 Claims, 3 Drawing Figures

PUSH-PULL SWITCHING CIRCUIT WITH MINORITY CARRIER STORAGE DELAY

BACKGROUND OF THE INVENTION

This invention relates to a grounded emitter, push-pull, transistor circuit, and particularly to such a circuit which completely eliminates the deleterious effects of minority carrier storage time even when the two transistors are alternately driven by a high-frequency input signal.

In recent years, in order to meet the handling convenience requirements of transistor push-pull circuits, and to cope with the space limitations imposed by the environments in which such circuits are used, efforts have been continuously and diligently made to reduce the size of push-pull circuits. One of the best and most effective ways to reduce the size of a push-pull switching circuit is to control the transistors used therein with a high-frequency input signal. The use of a high-frequency input signal makes it possible to utilize very small transformers, and correspondingly small chokecoils and condensors for smoothing voltage amplitude fluctuations.

When a high-frequency input signal is fed to the base electrodes of the push-pull transistors, however, there is a brief period during which the two transistors conduct simultaneously, i.e. one transistor is driven into a conducting state while the other transistor still remains conducting due to minority carrier storage. Such simultaneous conduction causes heavy currents to flow through the collector-emitter paths of the transistors, resulting in the deterioration and possible destruction of the transistors.

Minority carrier storage is caused by the accumulation of minority carriers in the base region when a transistor is driven in saturation.

To overcome the deleterious effects of such storage time, a circuit configuration as shown in FIG. 1 (taken from U.S. Pat. No. 3,421,099) has been proposed. With such a circuit configuration, however, the storage time problem cannot be completely eliminated. Referring to FIG. 1, a (lower) feedback path 42 derived from a feedback winding 44 is used to prevent an input signal from being fed to the base of a transistor 41 while the other transistor 40 is still conducting due to the minority carrier storage effect. A large number of turns in winding 44 is necessary, however, to bias the base of transistor 41 sufficiently negative to keep it cutoff even when an input signal is applied to its base. Consequently, heavy power losses result due to energy dissipated in the diode 48, the resistor 40, and the winding 44.

If the number of turns in winding 44 is decreased, however, the negative bias becomes insufficient and transistor 41 begins to conduct while transistor 40 is still conducting, due to the storage time effect. Thus, there is a time during which both transistors conduct simultaneously. When this occurs the magnetic fluxes generated in the transformer 28 by the currents flowing through the transistors 40 and 41 cancel each other, which reduces the collector loads to just the resistance of the primary winding. As a result, heavy collector currents flow through the transistors, which causes excessive power dissipation in them, and in some cases, their complete destruction.

SUMMARY OF THE INVENTION

These drawbacks and disadvantages of the prior art are effectively overcome by the present invention, according to which a push-pull switching circuit includes two grounded emitter transistors controlled by a pair of AND gates. The collector output of each transistor is fed back to an input of the AND gate controlling the other transistor, the remaining AND gate inputs being supplied by the Q and $\overline{Q}$ outputs of a flip-flop circuit. During the prolonged conduction of each transistor due to minority carrier storage, its lowered collector potential prevents the enabled AND gate for the other transistor from raising its output and initiating conduction, thereby avoiding overlapping or simultaneous transistor conduction.

Such a construction enables high frequency switching, reduces the size and weight requirements of the circuit, and minimizes power dissipation.

DETAILED DESCRIPTION OF THE PREFERRED EMBODIMENT

Figure 1:
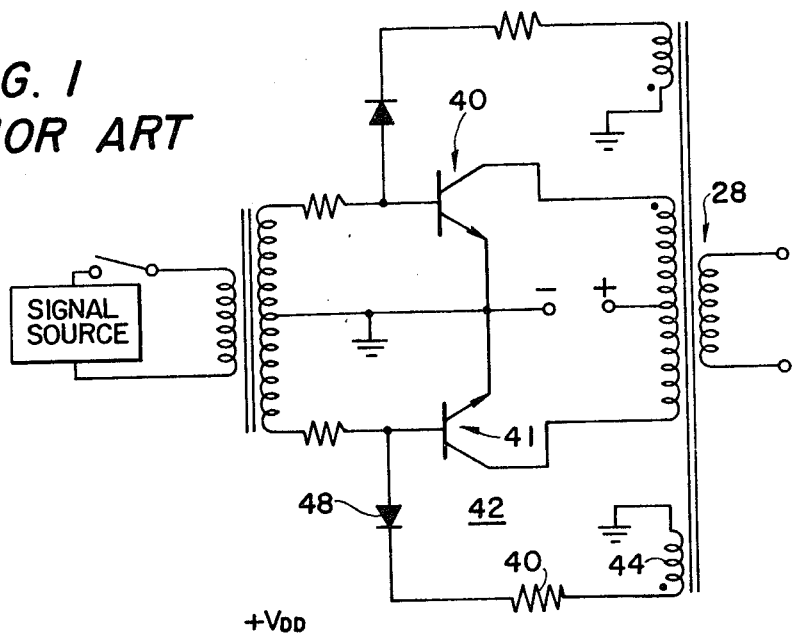
FIG. 1 is a schematic diagram of a prior art push-pull switching circuit.
Figure 2:
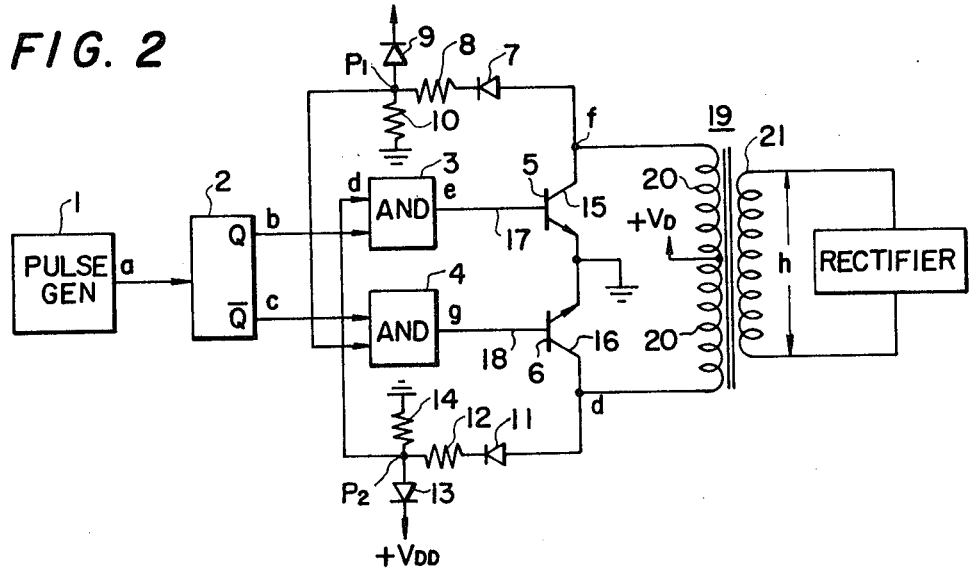
FIG. 2 is a schematic diagram of a push-pull switching circuit according to a preferred embodiment of the present invention.

Referring to FIG. 2, the output of a clock pulse generator 1, shown in FIG. 3(a), is connected to the input of a flip-flop circuit 2. The flip-flop circuit produces output waveforms at its Q and $\overline{Q}$ output terminals as shown in FIGS. 3(b) and 3(c), respectively. The output terminals Q and $\overline{Q}$ of the flip-flop circuit 2 are respectively connected to one input of AND gates 3 and 4. The outputs of the AND gates 3 and 4 are connected to the base electrodes of transistors 5 and 6, respectively, which form a grounded emitter push-pull circuit. The collector electrode of transistor 5 is coupled to the other input of AND gate 4 via a diode 7 and a resistor 8. The left-hand side of resistor 8 is connected to the anode of a diode 9 and to a grounded resistor 10. Similarly, the collector electrode of transistor 6 is coupled to the other input of AND gate 3 via a diode 11 and a resistor 12. The left-hand side of resistor 12 is connected to the anode of a diode 13 and to a grounded resistor 14. The cathodes of diodes 9 and 13 are connected to a DC voltage source $V_{DD}$. The resistors 8, 10 and 12, 14 serve to keep the junctions $P_1$ and $P_2$, respectively, at a suitable voltage level by dividing the voltages appearing at the collectors 15, 16 of the transistors 5, 6, respectively. These collector voltages are shown in FIGS. 3(d) and 3(f). The diodes 9, 13 protect the AND gates 4, 5 by limiting the peak amplitude of the voltages at junctions $P_1$ and $P_2$ to the value $+V_{DD}$ of the DC voltage source. The collector electrodes of transistors 5 and 6 are coupled to the upper and lower ends of a primary winding 20 of a transformer 19, respectively, whose center tap is connected to a DC voltage source $V_D$. A secondary winding 21 of the transformer is connected to a rectifier 22.

Figure 3:
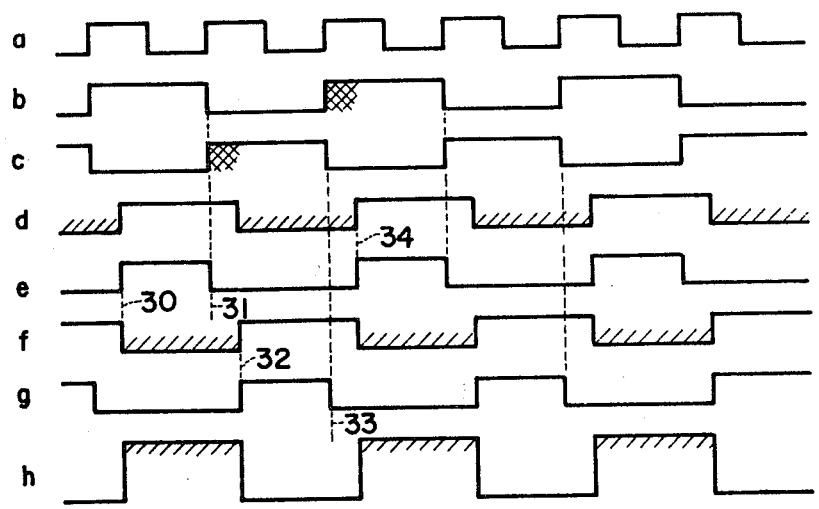
FIG. 3 is an explanatory waveform diagram of the signals generated in the circuit of FIG. 2.

The operation of the circuit shown in FIG. 2 will now be described with reference to the waveform diagrams of FIG. 3. Assume initially that the output signal (e) of AND gate 3 is raised at time 30 in FIG. 3(e), whereby transistor 5 becomes conductive. Signal (e) is lowered at time 31 by the amplitude reversal of the square wave (b), FIG. 3(b), but transistor 5 continues to conduct up to time 32 due to its minority carrier storage, as shown in FIG. 3(f). While transistor 5 is conducting the input to AND gate 4 derived from the collector 15 of the transistor is zero or lowered. Thus, AND gate 4 does not produce a raised output signal until time 32, even though it becomes enabled at time 31 by the square wave signal (c) applied to its other input terminal. After the minority carrier storage time between the time instants 31 and 32 has elapsed, positive or raised signals (c) and (f) appear at both of the inputs of AND gate 4. As a result, its output signal (g) is raised, which renders transistor 6 conductive.

In the same manner as described above, although the input signal (g) applied to the base of transistor 6 is lowered at time 33, the transistor continues to conduct up to time 34 due to its minority carrier storage. While transistor 6 is conducting, one of the inputs (d) to AND gate 3 is at a zero voltage level. Thus, AND gate 3 does not produce a raised output signal until time 34, in spite of its being enabled by the square wave signal (b) applied to its other input terminal. After the minority carrier storage time 33 – 34 has elapsed, positive signals (b) and (d) are applied to the inputs of AND gate 3, which raises its output signal (e). This in turn renders transistor 5 conductive again. In this manner, the transistors 5 and 6 are rendered alternately conductive in response to the output signals (b) and (c) from the flip-flop circuit 2. This induces a signal as shown in FIG. 3(h) across the secondary winding 21 of transformer 19, which is applied to the rectifier 22.

As described above, the feedback signals from the collectors 15, 16 of transistors 5, 6 to the inputs of AND gates 4, 3, respectively, prevent each transistor from becoming conductive (receiving a raised base signal) until the other transistor's continuing conduction, due to its minority carrier storage, has completely terminated. Consequently, the two push-pull transistors conduct alternately, but never simultaneously. Therefore, high-frequency input signals can be used to alternately drive the two grounded emitter transistors without any overlapping conduction, making it possible to reduce the overall size of the circuit.

Although AND gates 3 and 4 are shown in the embodiment of FIG. 2, the combination of a NAND gate and an inverter could also be used. Similarly, although NPN transistors have been shown, PNP transistors could also be used with minor circuit modifications, as could grounded collector configurations.

What is claimed is:

1. In a push-pull semiconductor switching circuit including an output transformer, first and second grounded emitter transistors whose collectors are connected to opposite ends of the primary winding of the transformer, and a pulse generator for alternately controlling the conduction of the transistors, the improvements characterized by:
    (a) a flip-flop circuit for producing Q and $\overline{Q}$ output signals in response to the pulse generator,
    (b) first and second AND gates each having one of its inputs respectively coupled to the Q and $\overline{Q}$ outputs of the flip-flop circuit, and their outputs connected to the bases of the first and second transistors, respectively,
    (c) means connecting the collector of the first transistor to the other input of the second AND gate, and
    (d) means connecting the collector of the second transistor to the other input of the first AND gate,
    (e) each connecting means comprising a first resistor, a second, grounded resistor connected to the first resistor to form a voltage divider therewith, and a voltage limiter connected to the junction of the first and second resistors.

2. A semiconductor switching circuit as defined in claim 1, wherein each voltage limiter comprises a diode connected to a D.C. voltage source.

3. A push-pull semiconductor switching circuit as defined in claim 1, wherein each connecting means further comprises a diode connected in series with said first resistor.

4. A push-pull semiconductor switching circuit as defined in claim 3, wherein each voltage limiter comprises a diode connected to a DC voltage source.

* * * * *